United States Patent
Cho et al.

(10) Patent No.: US 7,951,446 B2
(45) Date of Patent: May 31, 2011

(54) CONSTRAINING GREEN SHEET AND MANUFACTURING METHOD OF MULTI-LAYER CERAMIC SUBSTRATE

(75) Inventors: Beom Joon Cho, Yongin (KR); Jong Myeon Lee, Gwacheon (KR); Myung Whun Chang, Seoul (KR)

(73) Assignee: Samsung Electro-Mechanics Co., Ltd., Suwon, Gyunggi-do (KR)

( * ) Notice: Subject to any disclaimer, the term of this patent is extended or adjusted under 35 U.S.C. 154(b) by 0 days.

(21) Appl. No.: 12/265,561

(22) Filed: Nov. 5, 2008

(65) Prior Publication Data

US 2009/0117357 A1     May 7, 2009

(30) Foreign Application Priority Data

Nov. 6, 2007    (KR) .................. 10-2007-0112839

(51) Int. Cl.
*B32B 18/00* (2006.01)
*B32B 5/16* (2006.01)
*C04B 35/00* (2006.01)
(52) U.S. Cl. ........ 428/212; 428/323; 428/213; 428/448; 427/97.6
(58) Field of Classification Search .................. 428/212, 428/213, 323, 325, 448; 427/97.6
See application file for complete search history.

(56) References Cited

U.S. PATENT DOCUMENTS

2002/0155264 A1* 10/2002 Nishide et al. ................ 428/210
2006/0234023 A1* 10/2006 Endou et al. .................. 428/210

FOREIGN PATENT DOCUMENTS

| JP | 7-30253 | 1/1995 |
|---|---|---|
| JP | 2006-173456 | 6/2006 |
| JP | 2006173456 A * | 6/2006 |
| KR | 2002-0090296 | 12/2002 |

OTHER PUBLICATIONS

Machine English Translation of JP_2006/173456, Kurihara, K; Difficult-to-Sintering Constraining Green Sheet, and Manufacturing Method of Multilayer Ceramic Substrate, Jun. 29, 2006; JPO, pp. 1-26.*
Office Action dated Dec. 15, 2010, issued in Japanese Patent Application No. 2008-285333.

* cited by examiner

*Primary Examiner* — David R Sample
*Assistant Examiner* — Tahseen Khan
(74) *Attorney, Agent, or Firm* — McDermott Will & Emery LLP

(57) ABSTRACT

There is provided a hard-to-sinter constraining green sheet and a method of manufacturing a multilayer ceramic substrate using the same. The hard-to-sinter constraining green sheet disposed at least one of top and bottom surfaces of a non-sintered multi-layer ceramic substrate, the hard-to-sinter constraining green sheet including: a first constraining layer having a surface to be positioned on the multi-layer ceramic substrate, the first constraining layer including a first organic binder and a first inorganic powder having a spherical shape or a quasi-spherical shape; and a second constraining layer bonded to a top surface of the first constraining layer and including a second organic binder and a second inorganic powder having a flake shape, the second constraining layer having a powder packing density lower than that of the first constraining layer.

7 Claims, 3 Drawing Sheets

CONSTRAINING GREEN SHEET AND MANUFACTURING METHOD OF MULTI-LAYER CERAMIC SUBSTRATE

CROSS-REFERENCE TO RELATED APPLICATIONS

This application claims the priority of Korean Patent Application No. 2007-0112839 filed on Nov. 6, 2007, in the Korean Intellectual Property Office, the disclosure of which is incorporated herein by reference.

BACKGROUND OF THE INVENTION

1. Field of the Invention

The present invention relates to a method of manufacturing a multilayer ceramic substrate, and more particularly, to a hard-to-sinter constraining green sheet utilized for manufacturing a low-temperature co-fired substrate by constrained sintering, and a multilayer ceramic substrate using the same.

2. Description of the Related Art

In general, a multilayer ceramic substrate using glass-ceramics ensures implementation of a three-dimensional interlayer circuit and formation of a cavity. This allows devices with various functions to be embedded in the multi-layer ceramic substrate, with high flexibility in design.

Accordingly, in the market of smaller and higher-performing high-frequency parts, the multilayer ceramic substrate is increasingly utilized. A multi-layer ceramic substrate in an incipient stage has been manufactured by forming a circuit pattern and a via on a ceramic green sheet as a conductive electrode, arranging and stacking a plurality of the green sheet to a desired thickness according to design. In this process, the ceramic substrate shrinks in volume by about 35 to 50%. Particularly, the ceramic substrate shrinks about 12 to 17% in horizontal and vertical lengths, respectively in a transverse direction. This transverse shrinkage can be hardly controlled uniformly. The transverse shrinkage involves an error of 0.5% occurs in respective manufacturing stages and an identical manufacturing stage as well.

With the multilayer ceramic substrate more complicated and precise, inner patterns and via structures have less margin in design and thus constrained sintering is required to suppress transverse shrinkage of the multilayer ceramic substrate.

To this end, a hard-to-sinter flexible green sheet which is not sintered at a sintering temperature of the ceramic substrate material, is bonded to at least one of two surfaces of the multilayer ceramic substrate in order to suppress shrinkage of the multilayer ceramic substrate in a x-y direction. Notably, a load is applied onto the multilayer ceramic substrate to prevent the substrate from being warped during sintering. Here, the multilayer ceramic substrate may experience lack of passages for de-binding in the process of sintering, thereby degrading sintering characteristics. Moreover, a sintered ceramic stacked body may have great residual carbon content, which can undermine the reliability of the ceramic substrate.

Therefore, in order to impart a sufficient constraining force to the constraining green sheet, constrained material and process are required to allow the constraining green sheet is solidly bonded to the ceramic substrate and de-bound easily during sintering.

Japanese Patent Laid-open Publication No. hei 7-30253 discloses a conventional technology for de-binding. Under this technology, even when a constraining green sheet is employed, de-binding is relatively easily assured. Specifically, a hole is perforated in the constraining green sheet to ensure sufficient de-binding of an inner ceramic substrate and a resin which is more easily thermally decomposable than an organic binder included in a non-sintered ceramic stacked body is filled in the hole. However, this technology entails an additional burdensome process of perforating the hole in the constraining layer and deformability of a sintered body due to the hole.

Moreover, Korean Patent Publication No. 2002-0090296 discloses a technology in which an organic binder having an initial thermal decomposition temperature lower than an organic binder of a green sheet for a sintered body is employed in a constraining green sheet to remove the binder of the constraining green sheet and then the binder of the green layer of the sintered body is released easily through a passage generated thereby.

However, to maximize a constraining force of the constraining green sheet, a powder of the constraining layer should be pulverized and added in a higher amount to maximally increase a contact point between the constraining layer and the ceramic stacked body. This however may not ensure pores to be sufficiently formed inside the constraining green sheet. Unless pores are formed sufficiently, the binder decomposed or burned from the ceramic stacked body can hardly be released outward from hundreds of microns of the green sheet through pores inside the constraining green sheet, even though an organic material of the constraining green sheets is decomposed first. This does not yield sufficient de-binding effect.

Furthermore, an alternative technology is disclosed in Japanese Laid-open Publication No. 2006-173456. Under the technology, as shown in FIG. 1, a volume content of an organic binder 14 and an inorganic powder particle 12 of a constraining green sheet 15 is greater on an area around a free surface 15b than on an area around a contact surface 15a with a multilayer ceramic substrate 11. That is, the organic material contents differ between the contact surface and the free surface to enhance a bonding force between a ceramic substrate and a constraining layer and also to facilitate de-binding toward the free surface of the constraining layer with a greater number of pores.

However, since density gradients of components are formed through precipitation inside the constraining green sheet 15 using doctor blading, it is very hard to attain reproducibility of appropriate thickness and volume contents for respective areas. Moreover, under this technology, powder particles are easily precipitated onto the bottom when the constraining green sheet is formed, thereby requiring an inorganic powder with greater particle size, for example, twice greater than particles of the ceramic substrate to reduce an organic binder amount on the bottom. This renders it hard to obtain a sufficient contact point between the green sheet and the ceramic substrate. Furthermore, this hardly increases a capillary force for moving the organic binder from the ceramic substrate to the constraining green sheet.

SUMMARY OF THE INVENTION

An aspect of the present invention provides a constraining green sheet solidly bonded to a ceramic substrate for a sintered body to ensure a sufficient constraining force and guarantee smooth de-binding when sintered.

An aspect of the present invention also provides a method of manufacturing a multilayer ceramic substrate employing the constraining green sheet to ensure a sufficiently less shrinkage ratio and reduction in residual carbon content.

According to an aspect of the present invention, there is provided a hard-to-sinter constraining green sheet disposed at least one of top and bottom surfaces of a non-sintered multi-layer ceramic substrate, the hard-to-sinter constraining green sheet including: a first constraining layer having a surface to be positioned on the multi-layer ceramic substrate, the first constraining layer including a first organic binder and a first inorganic powder having a spherical shape or a quasi-spherical shape; and a second constraining layer bonded to a top surface of the first constraining layer and including a second organic binder and a second inorganic powder having a flake shape, the second constraining layer having a powder packing density lower than that of the first constraining layer so that the first constraining layer with a higher powder packing density can increase a capillary force enabling movement of a binder in the ceramic substrate, and the second constraining layer with a lower powder packing density can ensure a passage for de-binding. A content ratio of the second organic binder with respect to a total weight of the second constraining layer is lower than a content ratio of the first organic binder with respect to a total weight of the first constraining layer. The second inorganic powder has an average diameter (d) and an average thickness (h) in a predetermined range and satisfying h/d≦0.5. The average diameter (d) of the second inorganic powder is greater than an average particle size of the first inorganic powder.

The first constraining layer may have a powder packing density of 85% or more and the second constraining layer may have a powder packing density of 80% or less. Also, the first constraining layer may have a powder packing density that is at least 10% greater than a powder packing density of the second constraining layer.

The second inorganic powder may have an average diameter greater than an average particle size of the first inorganic powder.

The second inorganic powder may have an average diameter and an average thickness in a predetermined range, respectively and satisfying h/d≦0.5. The first inorganic powder may have an average particle size of 1.5 μm to 3 μm, and the second inorganic powder may have an average diameter of 2 μm to 20 μm and an average thickness of 0.1 μm to 1 μm.

The first and second inorganic powders may be shaped and sized differently from each other as described above but may be formed of an identical ceramic material. Also, the first and second organic binders may be an identical organic binder.

The first constraining layer may have a thickness that is 0.8 to 1.2 times a thickness of the second constraining layer.

According to another aspect of the present invention, there is provided a method of manufacturing a multilayer ceramic substrate, the method including: providing a non-sintered multilayer ceramic substrate having a plurality of low-temperature green sheets stacked thereon; disposing a hard-to-sinter constraining green sheet on at least one of top and bottom surfaces of the non-sintered multilayer ceramic substrate; sintering the non-sintered multilayer ceramic substrate while the hard-to-sinter constraining green sheet is arranged; and removing the resultant hard-to-sinter constraining green sheet from the sintered multilayer ceramic substrate, wherein the hard-to-sinter constraining green sheet includes: a first constraining layer adjacent to the multilayer ceramic substrate and including a first organic binder and a first inorganic powder having a spherical or quasi-spherical shape; and a second constraining layer including a second organic powder bonded to a top surface of the first constraining layer and including a second organic binder and a second inorganic powder having a flake shape, wherein the second constraining layer has a powder packing density lower than a powder packing density of the first constraining layer.

The disposing a hard-to-sinter constraining green sheet may include disposing the hard-to-sinter green sheet on each of the top and bottom of the non-sintered multilayer ceramic substrate.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE PREFERRED EMBODIMENT

Exemplary embodiments of the present invention will now be described in detail with reference to the accompanying drawings.

Figure 1:
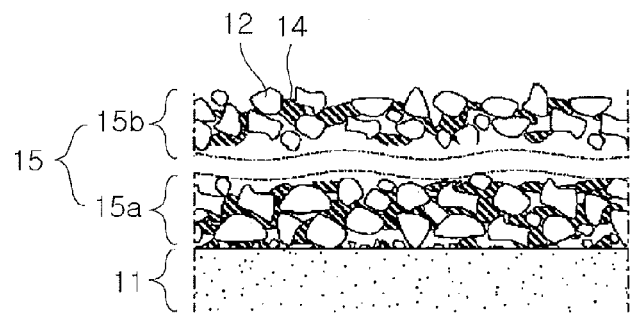
FIG. 1 is a cross-sectional view illustrating an example of a conventional hard-to-sinter constraining green sheet.
Figure 2:
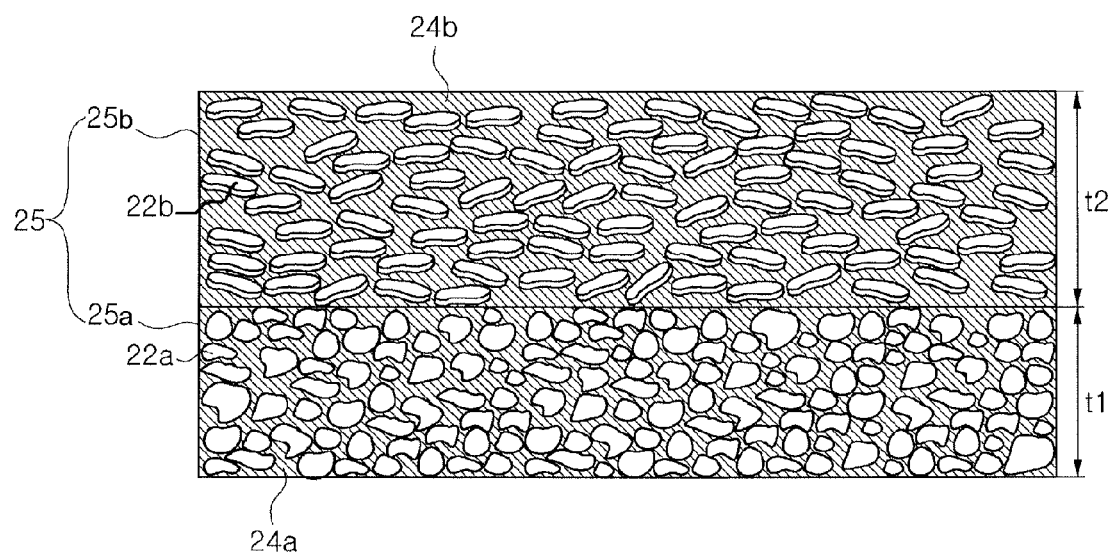
FIG. 2 is a cross-sectional view illustrating a hard-to-sinter constraining green sheet according to an exemplary embodiment of the invention.

FIG. 2 is a cross-sectional view illustrating a hard-to-sinter constraining green sheet according to an exemplary embodiment of the invention.

As shown in FIG. 2, the hard-to-sinter constraining green sheet 25 of the present embodiment includes a first constraining layer 25a providing a bonding surface to be positioned on a non-sintered multilayer ceramic substrate (not shown), and a second constraining layer 25b formed on the first constraining layer 25a.

The first constraining layer 25a includes a first inorganic powder 22a having a general shape, i.e., spherical or quasi-spherical shape and a first organic binder 24a. Meanwhile, the second constraining layer 25b includes a second inorganic powder 22b having a flake shape and a second organic binder 24b.

The second inorganic powder 22b employed in the second constraining layer 25b has a flake shape unlike the first inorganic powder 22a employed in the first constraining layer 25a, thus hardly packed densely due to the shape. Therefore, the second constraining layer 25b may have a powder packing density lower than a powder packing density of the first constraining layer 25a.

On the contrary, the first constraining layer 25a has a relatively higher powder packing density and accordingly has a sufficient contact point with the non-sintered multilayer ceramic substrate. Therefore, the first constraining layer 25a serves to apply a substantial constraining force during sintering, thus inhibiting shrinkage effectively, Moreover, the first constraining layer 25a with higher packing density can increase a capillary force enabling movement of the binder in the ceramic substrate.

Meanwhile, the second constraining layer 25b has a relatively low packing density due to the second inorganic powder 22b having a flake shape. This easily ensures a passage for de-binding.

In order to improve the aforesaid effects by virtue of differences in powder packing density, the first constraining layer 25a may have a powder packing density of 85% or more, and the second constraining layer 25b may have a powder packing density of 80% or less. Also, the first constraining layer 25a may have a powder packing density that is at least 10% greater than a powder packing density of the second constraining layer 25b.

The first inorganic powder 22a employed in the present invention has a spherical or quasi spherical shape similar to a general shape of a powder. On the other hand, the second inorganic powder 22b has a flake shape which is different from the general powder shape. The shape of this second inorganic powder 22b can be understood in more detail with reference to FIG. 3.

Figure 3:
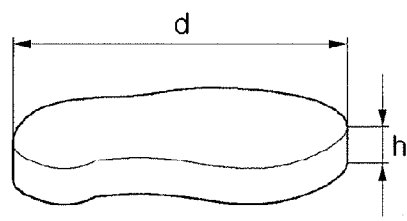
FIG. 3 is a schematic perspective view illustrating a particle shape of an inorganic powder (second inorganic powder) having a flake shape applicable to an exemplary embodiment of the invention.

Referring to FIG. 3, the second inorganic powder 22b has an average diameter d in a predetermined range and an average thickness h smaller than the mean diameter.

To sufficiently assure less packing density resulting from the flake shape, the second inorganic powder 22b may have an average diameter d greater than an average particle size of the first inorganic powder 22a. In line with this, the second inorganic powder (see 22b of FIG. 3) may have a flake shape satisfying $h/d \leq 0.5$.

More specifically, the first inorganic powder 22a may have an average particle size of 1.5 μm to 3 μm and the second inorganic powder 22b may have an average diameter of 2 μm to 20 μm and an average thickness of 0.1 μm to 1 μm.

In actual applications, the second inorganic powder 22b, when having too small a thickness h, may be fractured during milling to increase an h/d value and thus may have a thickness of 0.1 μm or more.

Generally, a constraining force inhibiting the substrate from shrinking in a plane direction mainly results from a binding force of a sintering inorganic binder element inside the ceramic substrate entering the constraining green sheet. As described above, the first inorganic powder 22a of the first constraining layer 25a has a high packing density to ensure a great binding force. Moreover, this process increases a capillary force and allows an organic binder in the substrate to be easily penetrated into the first constraining layer 25a and removed through the second constraining layer 25b having a relatively large passage for de-binding. This is because the second constraining layer 25b contains the inorganic powder of a flake shape and thus has a relatively smaller powder packing density.

Meanwhile, the first and second constraining layers 25a and 25b are fabricated by separate processes and then bonded together. The bonding may be previously performed to ensure the first and second constraining layers 25a and 25b to serve as one green sheet 25. Alternatively, without employing additional bonding, the first and second constraining layers 25a and 25b may be stacked as separate layers on the non-sintered ceramic substrate and bonded by thermal compression performed before firing.

The first and second constraining layers 25a and 25b may be fabricated by other method. However, the first and second constraining layers 25a and 25b can be easily bonded mechanically due to a difference in a powder shape of the first and second constraining layers 25a and 25b. This can double the constraining force in a plane direction.

The first and second inorganic powders employed in the present embodiment may be formed of an identical ceramic material. Also, to ensure the first and second constraining layers 25a and 25b to be bonded together more easily, the first and second organic binders 24a and 24b may be an identical organic binder. The first and second organic binders 24a and 24b may include an organic additive such as a dispersant in addition to the organic binder.

Here, the passage for de-binding depends on this residual organic content wt %. The "residual organic content" can be defined as a weight of an organic material including the organic binder with respect to a total weight of a total inorganic powder. The residual organic content is inversely proportional to the powder packing density. When a general organic additive is added in a substantially identical amount, to sufficiently ensure a passage for de-binding inside the second constraining layer 25b, a content ratio of the second organic binder 24b with respect to a total weight of the second constraining layer 25b may be lower than a content ratio of the first organic binder 24a with respect to a total weight of the first constraining layer 25a.

Moreover, to ensure the first and second constraining layers can perform their desired functions, the first constraining layer may have a thickness that is 0.8 to 1.2 times a thickness of the second constraining layer. But the present invention is not limited thereto. That is, the first and second constraining layers may have a thickness modified and designed appropriately according to conditions, such as thickness, shrinkage ratio or organic binder content, of the non-sintered ceramic substrate which is an object of firing.

Figure 4A:
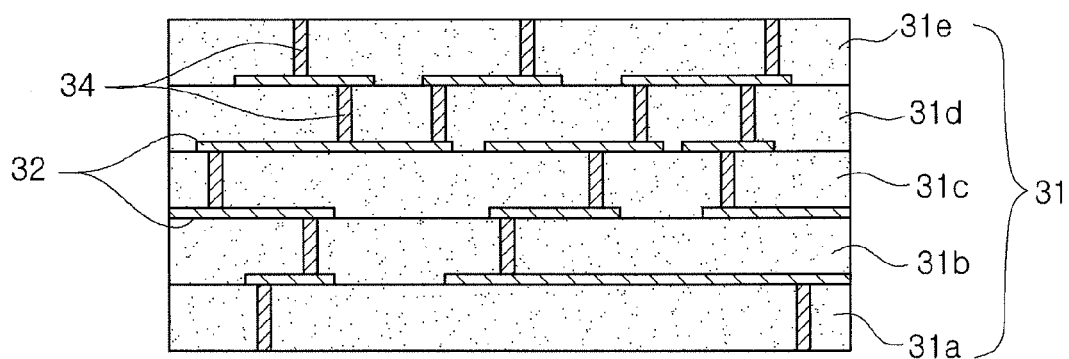
FIGS. 4A to 4C are procedural cross-sectional views illustrating a method of manufacturing a multilayer ceramic substrate according to an exemplary embodiment of the invention.
Figure 4B:
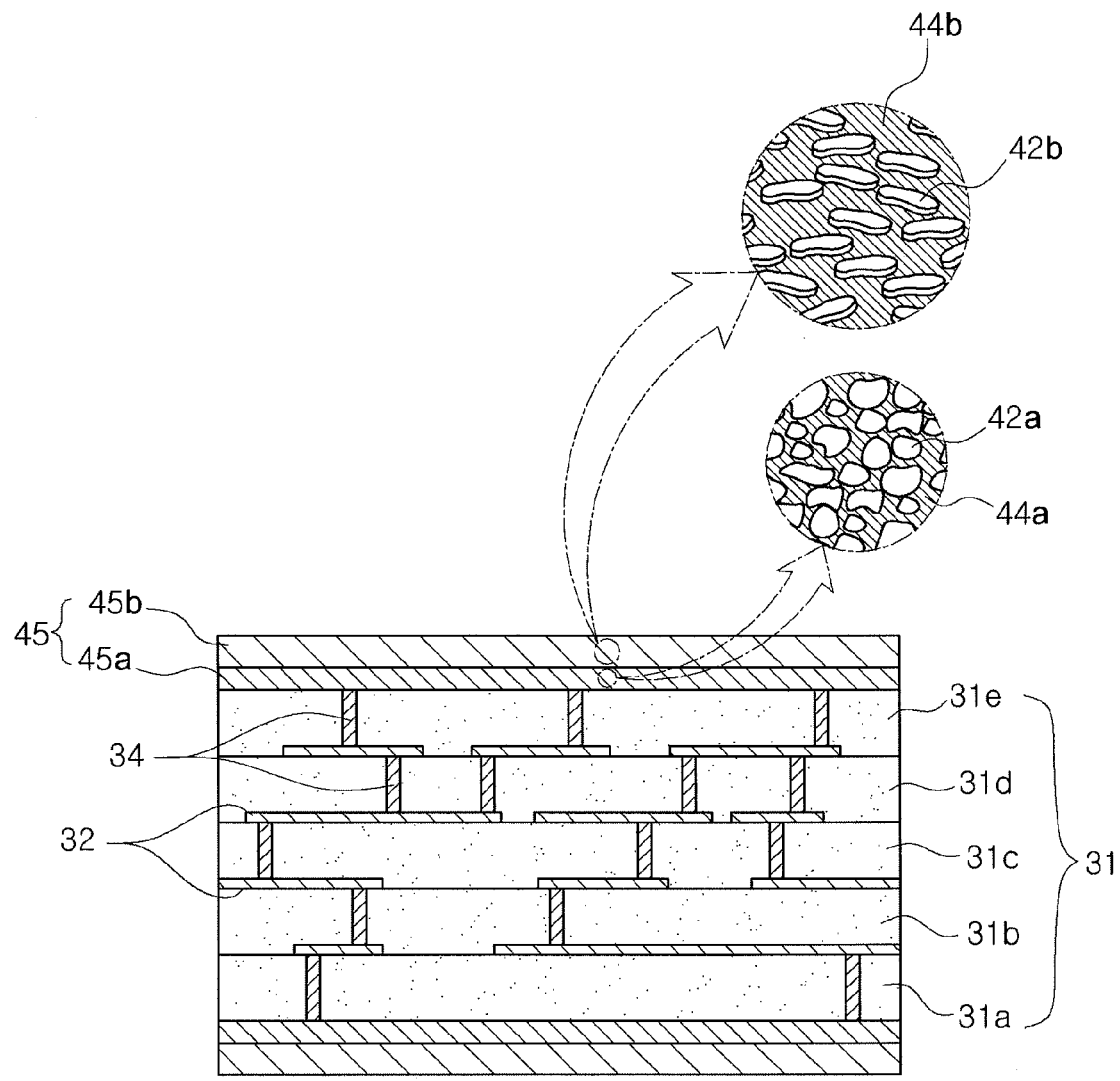
Figure 4C:
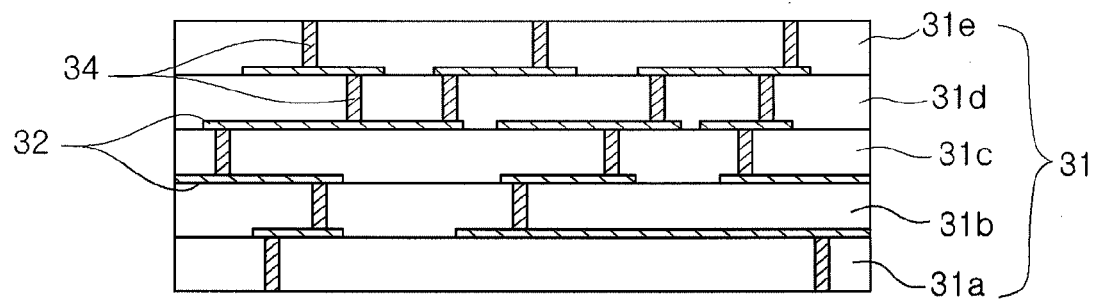

FIGS. 4A to 4C are procedural cross-sectional views illustrating a method of manufacturing a multilayer ceramic substrate according to an exemplary embodiment of the invention.

First, as shown in FIG. 4A, a non-sintered multilayer ceramic substrate 31 having a plurality of low temperature fired green sheets 31a to 31e stacked thereon is provided. The green sheets 31a to 31e may include an organic material such as a sinterable glass-ceramic powder and organic binder capable of being fired at a low temperature and can be fabricated by an appropriate known method. An electrode pattern 32 and a conductive via hole 34 are formed on each of the green sheets 31a to 31e to configure an interlayer circuit. Then, the green sheets 31a to 31e are stacked to provide a non-sintered multilayer ceramic substrate 31 as shown in FIG. 3A.

Thereafter, as shown in FIG. 4B, a hard-to-sinter constraining green sheet 45 is disposed on top and bottom surfaces of the non-sintered multilayer ceramic substrate 31. Then, the non-sintered multilayer ceramic substrate 31 is fired. The hard-to-sinter constraining green sheet 45 can be understood with reference to FIG. 2.

More specifically, the constraining green sheet 45 includes a first constraining layer 45a disposed on the non-sintered multilayer ceramic substrate 31 and a second constraining layer 45b formed on the first constraining layer 45a. The first constraining layer 45a includes a first inorganic powder 42a having a spherical or quasi-spherical shape and a first organic binder 44a. The second constraining layer 42b includes a second inorganic powder 42b having a flake shape and a second organic binder 44b. This allows the second constraining layer 45b to have a powder packing density lower than a powder packing density of the first constraining layer 45a.

The constraining green sheet 45 may be provided on one of the top and bottom surfaces of the ceramic substrate but may be disposed on both surfaces to reduce shrinkage effectively. Moreover, the first and second constraining layers 45a and 45b may be previously bonded into one layer by an additional process to be disposed on the ceramic substrate 31. Alternatively, without employing an additional bonding process, the first and second constraining layers may be stacked as separate layers on the non-sintered ceramic substrate 31 and then bonded by thermal compression performed after firing.

As shown in FIG. 4C, the resultant hard-to-sinter constraining green sheet 45 is removed from the multilayer ceramic substrate 31'. After firing, the hard-to-sinter constraining green sheet 45 is de-bound and remains as a powder and thus can be easily removed. As shown in FIG. 3C, the fired multilayer ceramic substrate 31' shrinks in a thickness direction but can be suppressed from shrinking in a plane direction, i.e., horizontally by the constraining green sheet 45.

As described above, the multilayer ceramic substrate 31 is suppressed from shrinking in a plane direction due to many contact points and high binding force by the first constraining layer 25a having high powder packing density. Also, this increases a capillary force to ensure that an organic binder inside the ceramic substrate 31 easily permeates into the first constraining layer 45a and is easily removed by the second constraining layer 45b having a large passage for de-binding and having a low packing density due to the inorganic powder of a flake shape.

As will be described below, a multilayer ceramic substrate was manufactured, and a constraining green (Inventive Example 1) meeting the conditions of the present embodiment and constraining green sheets (Comparative Examples 1 to 3) outside the conditions of the present embodiment were fabricated and subjected to firing.

[Fabricating a Non-Sintered Multilayer Ceramic Substrate]

An acrylic binder was added at 15 wt % and a dispersant was added at 0.5 wt % with respect to a glass-ceramic powder. Then, a mixed solution of toluene and ethanol was added and dispersed using a ball mill to produce a slurry. The slurry obtained was filtered and deareated, and a green sheet having a thickness of 50 μm was formed using doctor blading. The green sheet was cut in a predetermined size and a predetermined electrode pattern was formed by screen printing. Afterwards, 20 layers of green sheets were pressed and stacked to fabricate a unified non-sintered multilayer ceramic stacked body.

[Fabricating a Constraining Green Sheet]

Table 1 below notes the shape of an inorganic powder according to kinds of constraining layers in Inventive Example 1 and Comparative Examples 1 to 3. Constraining layers according to Inventive Example and Comparative Examples were fabricated under these conditions as follows.

TABLE 1

|  | First constraining layer | Second constraining layer |
|---|---|---|
| Inventive Ex. | General (spherical or quasi-spherical) | Flake shape |
| Comparative Ex. 1 | General | General |
| Comparative Ex. 2 | Flake shape | Flake shape |
| Comparative Ex. 3 | Flake shape | General |

Here, a general powder denotes an alumina powder having an average particle size of about 1.5 μm and a flake shape powder denotes an alumina powder having an average diameter of about 10 μm and an average thickness of about 0.2 μm.

Inventive Example

The constraining green sheet was fabricated under the conditions of the present embodiment to include first and second constraining layers as follows.

According to inventive Example of Table 1 above, to form the first constraining layer, an acrylic binder was added at 15 wt % and a dispersant was added at 0.5 wt % with respect to an alumina powder having an average particle size of 1.5 μm, and a mixed solution of toluene and ethanol was added. Then, the mixture was dispersed using a ball mill to produce a slurry. This slurry obtained was filtered and deareated, and a green sheet having a thickness of 100 μm was formed using doctor blading.

Moreover, to form the second constraining layer, an acrylic binder was added at 15 wt % and a dispersant was added at 0.5 wt % with respect to an alumina powder of a flake shape having an average diameter of 10 μm and a thickness of about 0.2 μm, and a mixed solution of toluene and ethanol was added and dispersed using a ball mill to produce a slurry. This slurry obtained was filtered and deareated, and a green sheet having a thickness of 100 μm was formed using doctor blading.

Figure 5:
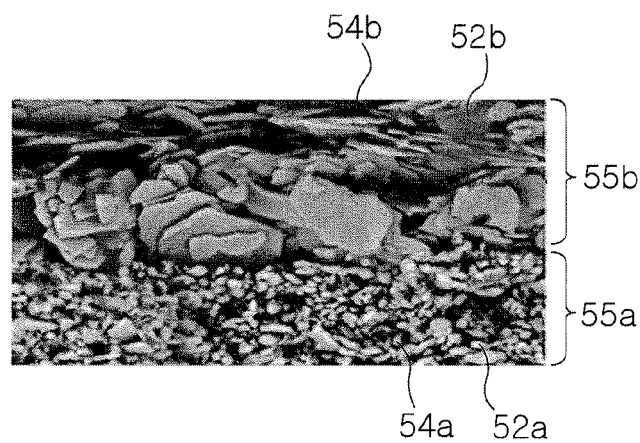
FIG. 5 is a scanning electron microscope (SEM) picture illustrating a cross-section of a hard-to-sinter constraining green sheet according to an exemplary embodiment of the invention.

FIG. 5 is a scanning electron microscope (SEM) picture illustrating a cross-section of a hard-to-sinter constraining green sheet according to an exemplary embodiment of the invention.

Comparative Examples 1 to 3

Moreover, to conduct comparative tests, to produce Comparative Examples 1 and 2, respectively, an alumina powder having an average particle size of 1.5 μm and an alumina powder of a flake shape having an average diameter of about 10 μm and a thickness of about 0.2 μm were employed to form a constraining green sheet having a thickness of 100 μm by the mixing condition and process similar to those of Inventive Example.

Moreover, Comparative Example 3 was produced under the same condition as the present embodiment. But the difference was that an alumina powder of a flake shape having an average diameter of about 10 μm and a thickness of about 0.2 μm was employed to form a first constraining layer and an alumina powder having an average particle size of 1.5 μm was employed to form a second constraining layer in fabricating a constraining green sheet.

Bonding Between the Ceramic Substrate and the Constraining Green Sheet

The constraining green sheet was cut in an identical size to the non-sintered ceramic substrate. Then, the two cut constraining green sheets were attached on each of two main surfaces of the non-sintered ceramic substrate and then thermally compressed under a pressure of 300 kgf/cm$^2$ and at a temperature of 85° C. to manufacture a unified stacked body. That is, the two constraining green sheets fabricated as noted in Table 1 above were employed.

De-Binding and Sintering

Temperature was increased at a rate of 60° C. per hour until 420° C. up to which an organic material is decomposed from a room temperature. To ensure sufficient de-binding time, the temperature was kept at 420° C. for two hours. After de-binding, the temperature was increased to 300° C. per hour until reaching a firing temperature of 870° C., and then maintained at 870° C. for 30 minutes to sinter the green sheet. After sintering, the green sheet was cooled down to a room temperature to obtain a sintered body.

A green layer was removed from the sintered body obtained, and a residual carbon content and shrinkage ratio of the ceramic substrate were measured. Table 2 below notes firing results of the ceramic substrate in which constraining layers of each condition are combined.

TABLE 2

|  | Residual carbon content [ppm] | Shrinkage [ratio %] |
| --- | --- | --- |
| Inventive Ex. | 36 | 0.58 |
| Comparative Ex. 1 | 102 | 0.22 |
| Comparative Ex. 2 | 33 | 0.65 |
| Comparative Ex. 3 | 39 | 0.24 |

As shown in the result of Comparative Example 1 noted in Table 2 above, the constraining green sheet formed of a general powder exhibits a strong constraining force for inhibiting shrinkage due to greater contact points with the ceramic substrate and an increase in a capillary force. Meanwhile, Comparative Example 1 does not ensure a sufficient passage for de-binding, thus demonstrating a high residual carbon content.

Moreover, Comparative Examples 2 and 3 show relatively low residual carbon contents but weak constraining force for inhibiting shrinkage of the ceramic substrate, thus leading to a high shrinkage ratio.

In contrast, as for Inventive Example, shrinkage can be reduced by the first constraining layer rather than the second constraining layer. Thus, Inventive Example is suppressed from shrinking as demonstrated in Comparative Example 1. At the same time, in terms of a residual carbon content after firing, Inventive Example shows a low residual organic content due to a capillary effect of the first constraining layer and a passage for de-binding assured in the second constraining layer.

As set forth above, according to exemplary embodiments of the invention, first and second constraining layers have a packing density different from each other by utilizing powder of different shapes and thus effectively inhibit shrinkage in a horizontal direction. Also, a ceramic substrate can be subjected to smooth de-binding. Moreover, a superior multilayer ceramic substrate with a low residual carbon content can be manufactured by constrained sintering using a constraining green sheet.

While the present invention has been shown and described in connection with the exemplary embodiments, it will be apparent to those skilled in the art that modifications and variations can be made without departing from the spirit and scope of the invention as defined by the appended claims.

What is claimed is:

1. A hard-to-sinter constraining green sheet disposed at least one of top and bottom surfaces of a non-sintered multi-layer ceramic substrate, the hard-to-sinter constraining green sheet comprising:

a first constraining layer having a surface to be positioned on the multi-layer ceramic substrate, the first constraining layer including a first organic binder and a first inorganic powder having a spherical shape or a quasi-spherical shape; and a second constraining layer bonded to a top surface of the first constraining layer and including a second organic binder and a second inorganic powder having a flake shape, the second constraining layer having a powder packing density lower than that of the first constraining layer, so that the first constraining layer with a higher powder packing density can increase a capillary force enabling movement of a binder in the ceramic substrate, and the second constraining layer with a lower powder packing density can ensure a passage for de-binding, wherein a content ratio of the second organic binder with respect to a total weight of the second constraining layer is lower than a content ratio of the first organic binder with respect to a total weight of the first constraining layer, the second inorganic powder has an average diameter (d) and an average thickness (h) in a predetermined range and satisfying $h/d \leq 0.5$, and the average diameter (d) of the second inorganic powder is greater than an average particle size of the first inorganic powder.

2. The hard-to-sinter constraining green sheet of claim 1, wherein the first constraining layer has a powder packing density of 85% or more and the second constraining layer has a powder packing density of 80% or less.

3. The hard-to-sinter constraining green sheet of claim 2, wherein the first constraining layer has a powder packing density that is at least 10% greater than a powder packing density of the second constraining layer.

4. The hard-to-sinter constraining green sheet of claim 1, wherein the first inorganic powder has an average particle size of 1.5 μm to 3 μm, and the second inorganic powder has an average diameter of 2 μm to 20 μm and an average thickness of 0.1 μm to 1 μm.

5. The hard-to-sinter constraining green sheet of claim 1, wherein the first and second inorganic powders are formed of an identical ceramic material.

6. The hard-to-sinter constraining green sheet of claim 1, wherein the first and second organic binders comprise an identical organic binder.

7. The hard-to-sinter constraining green sheet of claim 1, wherein the first constraining layer has a thickness that is 0.8 to 1.2 times a thickness of the second constraining layer.

* * * * *